United States Patent
Chang

(10) Patent No.: US 7,533,329 B2
(45) Date of Patent: May 12, 2009

(54) METHOD FOR SIMPLIFYING A VITERBI DECODER AND A SIMPLIFIED VITERBI DECODER USING THE SAME

(75) Inventor: Chia-Yen Chang, Taipei (TW)

(73) Assignee: Lite-On It Corporation, Science Park, Hsinchu (TW)

( * ) Notice: Subject to any disclaimer, the term of this patent is extended or adjusted under 35 U.S.C. 154(b) by 428 days.

(21) Appl. No.: 11/161,015

(22) Filed: Jul. 19, 2005

(65) Prior Publication Data
US 2006/0020876 A1 Jan. 26, 2006

(30) Foreign Application Priority Data
Jul. 20, 2004 (TW) .............................. 93121611 A

(51) Int. Cl.
*H03M 13/00* (2006.01)
(52) U.S. Cl. .................. 714/795; 375/262; 375/341
(58) Field of Classification Search .............. 369/59.22, 369/47.35, 47.15, 53.31, 59.21, 59, 23, 124.05; 375/262, 341; 714/794, 795
See application file for complete search history.

(56) References Cited

U.S. PATENT DOCUMENTS

| | | | | |
|---|---|---|---|---|
| 5,509,021 A | * | 4/1996 | Todoroki ..................... 714/795 |
| 5,644,603 A | * | 7/1997 | Ushirokawa ................. 375/341 |
| 5,719,843 A | * | 2/1998 | Nakajima et al. ......... 369/59.22 |
| 5,724,390 A | * | 3/1998 | Blaker et al. ................. 375/229 |
| 6,097,769 A | * | 8/2000 | Sayiner et al. ............... 375/341 |
| 6,240,145 B1 | * | 5/2001 | Koizumi ...................... 375/341 |
| 6,603,722 B1 | * | 8/2003 | Taguchi et al. ............ 369/59.21 |
| 6,678,862 B1 | * | 1/2004 | Bergmans et al. ........... 714/794 |
| 6,744,814 B1 | * | 6/2004 | Blanksby et al. ............. 375/232 |
| 6,771,580 B2 | * | 8/2004 | Uchida et al. ............ 369/59.22 |
| 7,225,393 B2 | * | 5/2007 | Kamada ...................... 714/795 |
| 2003/0072242 A1 | * | 4/2003 | Uchida et al. ............ 369/59.22 |
| 2004/0261005 A1 | | 12/2004 | Lee et al. |
| 2005/0193318 A1 | * | 9/2005 | Okumura et al. ............ 714/795 |

FOREIGN PATENT DOCUMENTS

TW               595117              6/2004

\* cited by examiner

*Primary Examiner*—Guy J Lamarre
*Assistant Examiner*—Sam Rizk
(74) *Attorney, Agent, or Firm*—Winston Hsu

(57) ABSTRACT

A method for simplifying a Viterbi decoder includes receiving a partial response, and determining an amount of redundant selector modules according to a tap number of the partial response; analyzing an output signal of the redundant selector modules for determining an initial input signal; and taking Viterbi decoding process to a sequence of data in the Viterbi decoder according to a forward trace status and the initial input signal.

9 Claims, 9 Drawing Sheets

| Original signal Sii | 0 | 1 | 1 | 1 | 0 | 0 | 0 | 1 | 1 | 1 | 1 |
|---|---|---|---|---|---|---|---|---|---|---|---|
| Partial response encoding | -1 | -2 | -1 |  |  |  |  |  |  |  |  |
|  |  | 1 | 2 | 1 |  |  |  |  |  |  |  |
|  |  |  | 1 | 2 | 1 |  |  |  |  |  |  |
|  |  |  |  | 1 | -2 | -1 |  |  |  |  |  |
|  |  |  |  |  | -1 | -2 | -1 |  |  |  |  |
|  |  |  |  |  |  | -1 | -2 | -1 |  |  |  |
|  |  |  |  |  |  |  | -1 | -2 | 1 |  |  |
|  |  |  |  |  |  |  |  | 1 | 2 | 1 |  |
|  |  |  |  |  |  |  |  |  | 1 | 2 | 1 |
| Signal DTi |  | 2 | 4 | 2 | -2 | -4 | -4 | -2 | 2 | 4 | 4 |
| Signal DTo |  | 1 | 1 | 0 | 0 | 0 | ? | 1 | ? | ? |  |

Fig. 4  Prior art

| Original signal Sii | 0 | 1 | 1 | 1 | 0 | 0 | 0 | 0 | 1 | 1 | 1 | 1 |
|---|---|---|---|---|---|---|---|---|---|---|---|---|
| Signal DTi | | 2 | 4 | 2 | -2 | -4 | -4 | -2 | 2 | 4 | 4 | |
| Viterbi decoding | 0 | 1 1 | 1 1 | 1 1 | | | 0 0 | 0 0 | ?. ?. | 1 1 | ?. | |
| Signal DTo | 0 | 1 | 1 | 1 | 0 | 0 | 0 | 0 | ?. | 1 | ?. | |

Fig. 7

METHOD FOR SIMPLIFYING A VITERBI DECODER AND A SIMPLIFIED VITERBI DECODER USING THE SAME

BACKGROUND OF THE INVENTION

1. Field of the Invention

The present invention provides a Viterbi decoder, and more particularly, a Viterbi decoder with less selector modules in response to taps of a partial response for preventing from signal delays and increasing efficiency when decoding.

2. Description of the Prior Art

Partial response maximum likelihood, or PRML, has been utilized in a plurality of digital signal processes, which modulates original signals with a partial response, so as to output modulated signals through a channel to a receiver of maximum likelihood sequence estimation, or MLSE, and a Viterbi detector is one of those circuits detecting convolution codes based on MLSE.

As those skilled in the art recognized, a communication channel always includes additive white Gaussian noise, (or AWGN), or other interferences, so that a communication system encodes data before transmitting for decreasing detection errors. For example, applied a specific algorithm, data is convoluted to more bits before being transmitted. Therefore, based on the algorithm, the communication system can detect whether the received data is correct or not, and even return wrong bits in the data to right.

Please refer to FIG. 1, which illustrates a block diagram of a prior art Viterbi decoder 10. The Viterbi decoder 10 includes a branch metric unit 12, an add-compare-select unit 14, a path memory module 18, a path metric memory module 16 and an output selector 20. The branch metric unit 12 receives a sequence of signals DTi, and transmits the signals DTi to the add-compare-select unit 14 through a plurality of branch paths according to a default setting of the Viterbi decoder 10. The add-compare-select unit 14 determines path metrics of the signals DTi by means of Viterbi algorithm based on MLSE, and outputs the path metrics to the path metric memory module 16. Meanwhile, the add-compare-select unit 14 calculates a plurality of state values and outputs to the path memory module 18. The path memory module 18 includes a plurality of selector modules in a series connection. The output selector 20 determines a sequence of output signals DTo according to signals outputted from the path memory module 18. As to operations of the Viterbi decoder 10, take tap number of the partial response being 3, or PR(1,2,1), for example. In this case, the Viterbi decoder 10 includes four states, and the branch metric unit 12 transmits the signals DTi to the add-compare-select unit 14 through six branches. Please refer to FIG. 2 and FIG. 3. FIG. 2 illustrates a state diagram of Viterbi algorithm with four states S00, S01, S10, and S11, while FIG. 3 illustrates a schematic diagram of the path memory module 21 corresponding to the state diagram in FIG. 2.

As shown in FIG. 2, input values (or original data) 0 and 1 in each state generate corresponding output values (or coded signals), which can be 4, 2, −2, and −4. After the coded signals is sent to a communication channel, the coded signals may suffer interference, yet the add-compare-select unit 14 can determine a result closest to the original data according to Viterbi algorithm. In FIG. 3, the path memory module 21 includes eleven selector modules 22 for decoding input signals having ten bits. Each selector module 22 includes four registers 24 and two selectors 26. The selectors 26 determine the output signals according to select signals S0 & S1 provided by the add-compare-select unit 14. Formulas for the add-compare-select unit 14 to calculate path metric values for determining the select signals S0 & S1 are as follow:

$$P(t,S00)=\min\{(P(t-1,S00)+B(t,-4)),(P(t-1,S10)+B(t,-2))\}$$

$$P(t,S01)=P(t-1,S00)+B(t,-2)$$

$$P(t,S10)=P(t-1,S11)+B(t,-2)$$

$$P(t,S11)=\min\{(P(t-1,S01)+B(t,2)),(P(t-1,S11)+B(t,4))\}$$

$$S0 = 0 \text{ for} (P(t-1, S00) + B(t, -4)) < (P(t-1, S10) + B(t, -2))$$
$$= 1 \text{ for otherwise}$$
$$S1 = 0 \text{ for } (P(t-1, S01) + B(t, 2)) < (P(t-1, S11) + B(t, 4))$$
$$= 1 \text{ for otherwise}$$

where P(t) is a path metric value, and B(t) is path value.

The above states of a Trellis tree and related operations are well-known in the art, so this paragraph will not disclose further. As long as the path metric values and the select signals S0 & S1 are determined continuously, the output signals DTo can be obtained.

For example, continuing with FIG. 2 and FIG. 3, please refer to FIG. 4, which illustrates a table of signals DTi and DTo of the Viterbi decoder 10 having four states. In FIG. 4, original signals Sii are encoded to the signals DTi with the partial response. After receiving the signals DTi, the Viterbi decoder 10 having four states decodes the signals DTi to the signals DTo according to the above-mentioned Viterbi algorithm. As shown in FIG. 4, the sequence of the signals DTo delays two bits comparing to the original signals Sii (that is, the sequence of the signals DTo lacks the first and second bits of the signals Sii). Therefore, the prior art Viterbi decoder 10 cannot decode the first two bits of the original signals Sii. In addition, the question marks of the signals DTo in FIG. 3 means that the Viterbi decoder 10 has not yet converged, so that as long as the longer sequence of signals DTi is received, the correct original signals Sii can be decoded.

However, if the sequence of the signals DTi becomes much longer, the prior art Viterbi algorithm needs more memory space, meaning that the path memory module 21 should include more selector modules 22 for generating the convergent output signals DTo, so that the prior art Viterbi decoder 10 costs a lot of system resources for generating a reliable result, but the result delays some bits comparing to the original signal. For example, a path memory module of a Viterbi decoder of a prior art high-density digital-versatile-disc drive, or HD-DVD drive, should include twenty selector modules, but output signals of the Viterbi decoder of the HD-DVD drive delay three bits comparing to the original signals.

In summary, delays of the output signals and demands of the selector modules cause the prior art Viterbi decoder to be unable to increase efficiency and to waste system resources.

SUMMARY OF THE INVENTION

It is therefore a primary objective of the claimed invention to provide a method for simplifying a Viterbi decoder.

According to the claimed invention, a method for simplifying a Viterbi decoder includes: receiving a partial response, and determining an amount of redundant selector modules according to a tap number of the partial response; analyzing an output signal of the redundant selector modules for determining an initial input signal; and taking Viterbi decoding process to a sequence of data in the Viterbi decoder according to a forward trace status and the initial input signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates a table of received and decoded signals of a prior art Viterbi decoder having four states.

FIG. 7 illustrates a schematic diagram of output signals of a four-state Viterbi decoder in accordance with the present invention.

DETAILED DESCRIPTION

Figure 5:
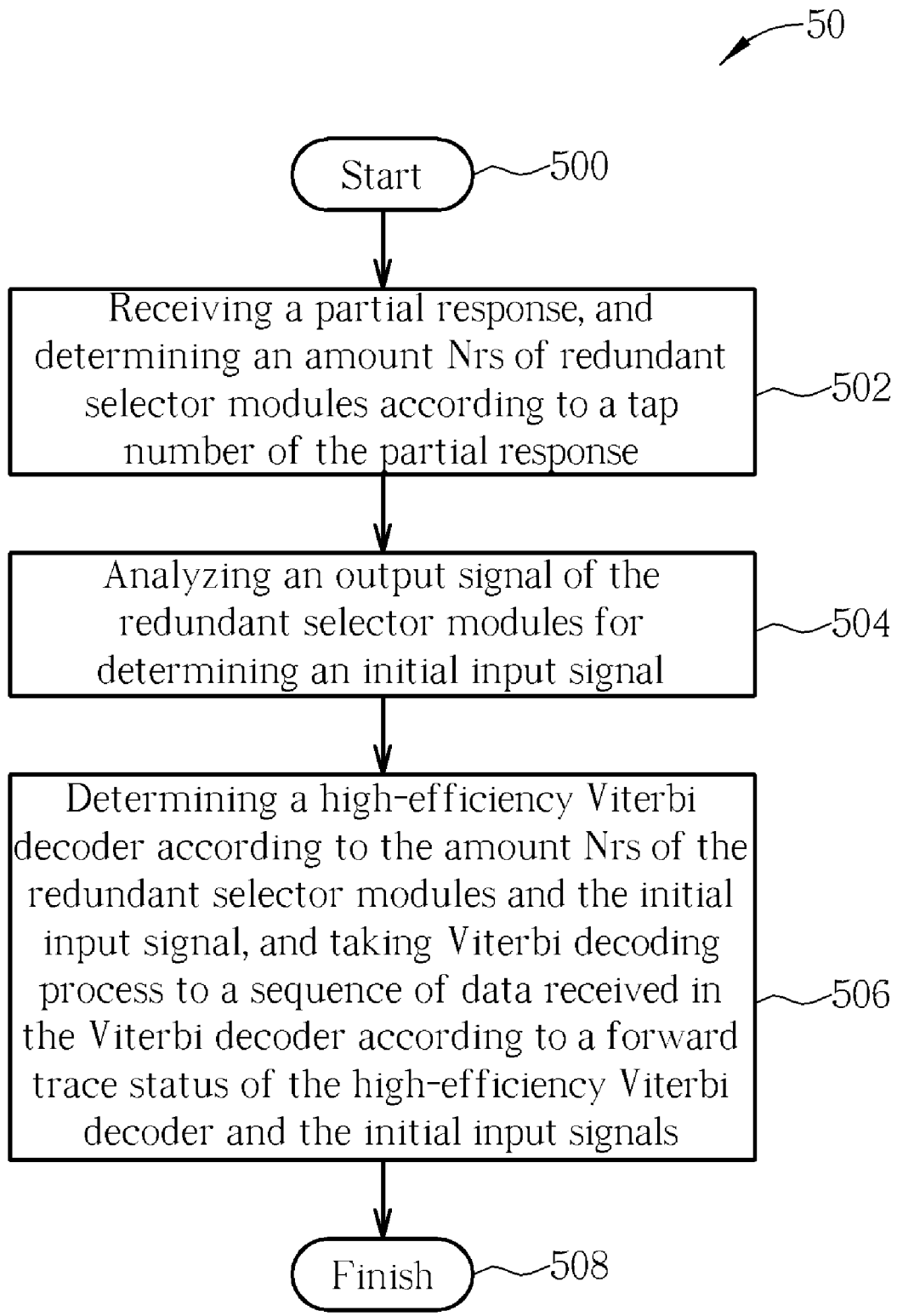
FIG. 5 illustrates a flowchart of a process in accordance with the present invention.

In order to improve delays of output signals and demands of selector modules of a prior art Viterbi decoder, the present invention decodes received signals of a Viterbi decoder based on states of the Viterbi decoder. Please refer to FIG. 5, which illustrates a flowchart of a process 50 in accordance with the present invention. The process 50 includes following steps:

Step 500: start.

Step 502: receiving a partial response, and determining an amount Nrs of redundant selector modules according to a tap number of the partial response.

Step 504: analyzing an output signal of the redundant selector modules for determining an initial input signal.

Step 506: determining a high-efficiency Viterbi decoder according to the amount Nrs of the redundant selector modules and the initial input signal, and taking Viterbi decoding process to a sequence of data received in the Viterbi decoder according to a forward trace status of the high-efficiency Viterbi decoder and the initial input signals.

Step 508: finish.

Referring to following paragraph, describing that the present invention process 50 improves decoding efficiency of a prior art Viterbi decoder based on the viewpoint of states. Back to FIG. 3, owing to the partial response PR(1,2,1), the output signal of the first-stage selector module 2201 of the path memory module 18 is (0,0,1,1).

Figure 1:
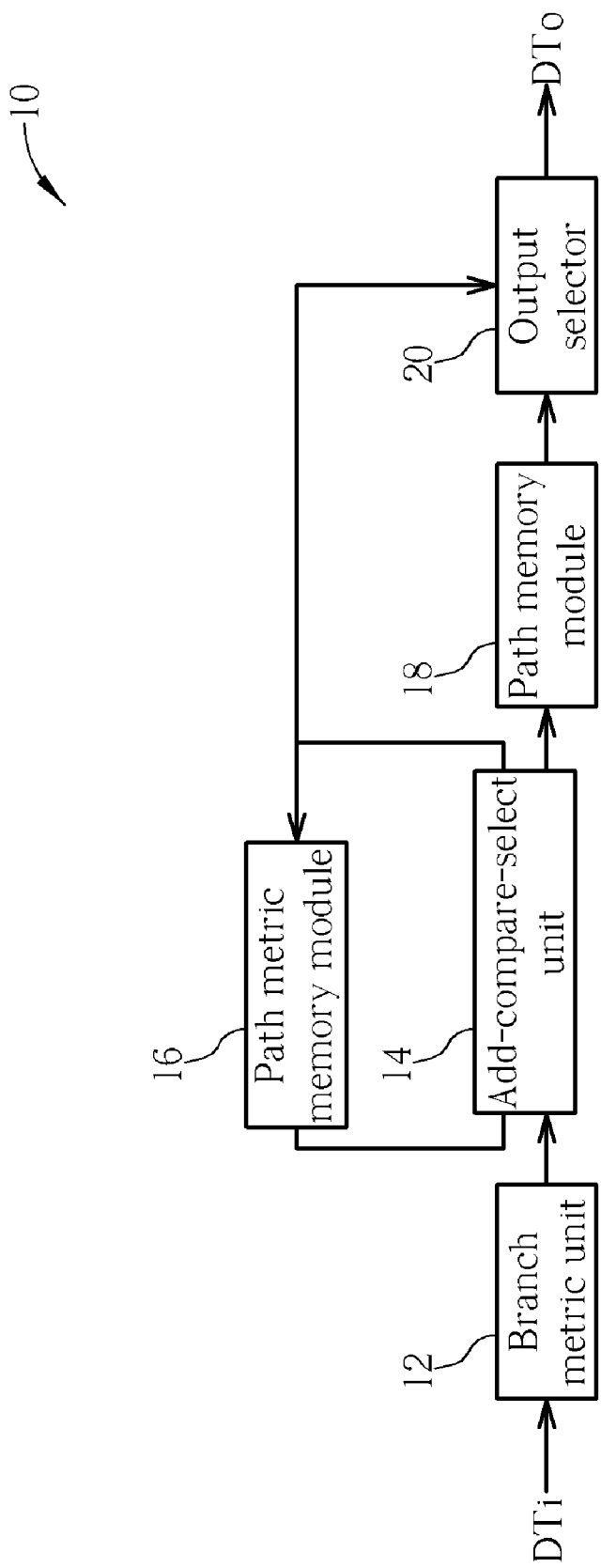
FIG. 1 illustrates a block diagram of a prior art Viterbi decoder.
Figure 2:
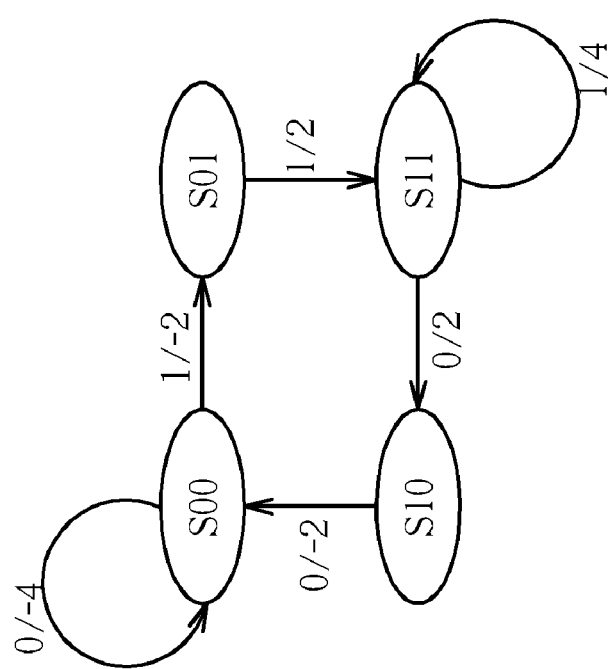
FIG. 2 illustrates a state diagram of Viterbi algorithm with four states S00, S01, S10, and S11.
Figure 3:
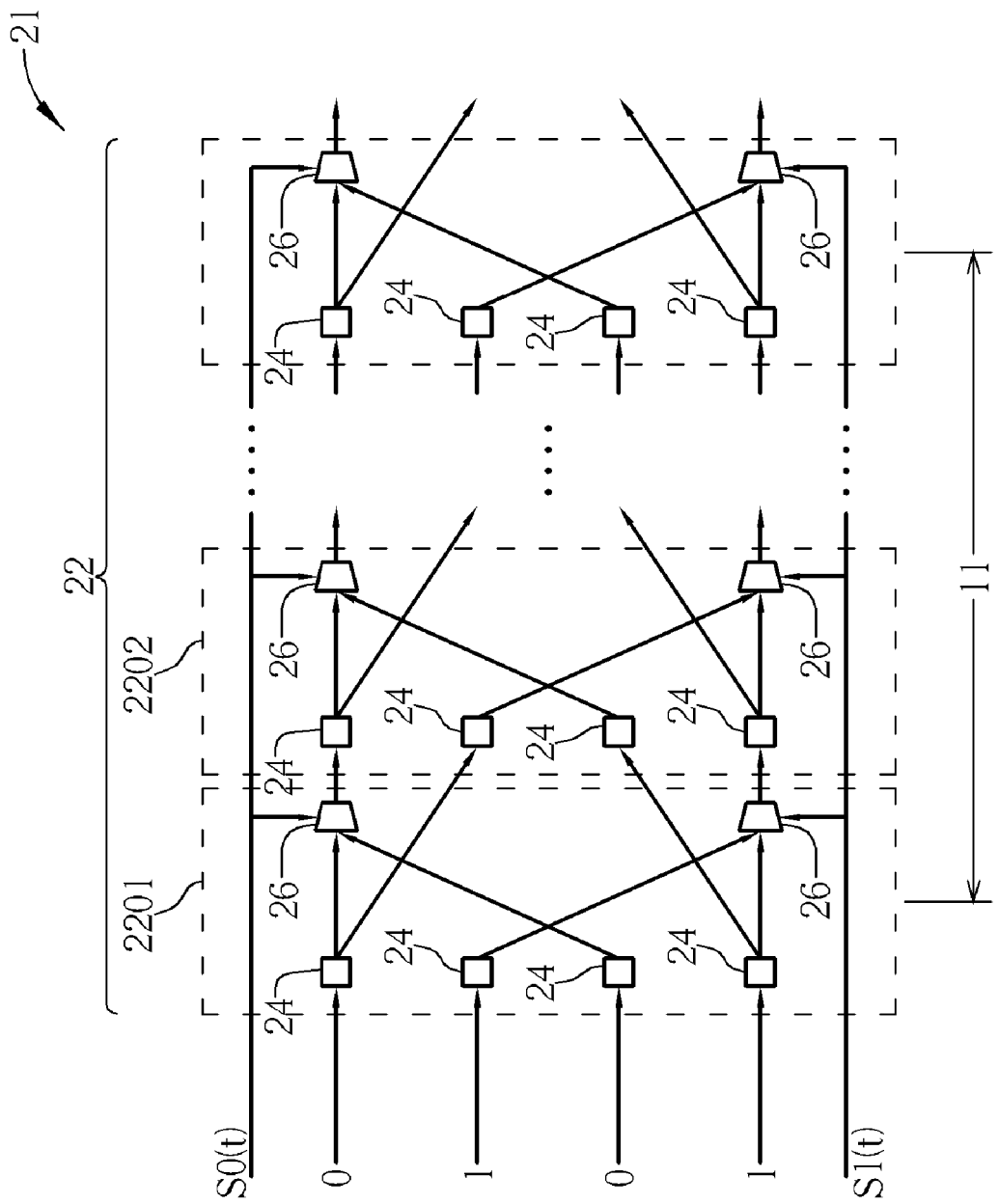
FIG. 3 illustrates a schematic diagram of a path memory module corresponding to a state diagram in FIG. 2.

Therefore, as long as the Viterbi decoder having four states takes (0,0,1,1) as the initial input signal of the second-stage selector module 2202 of the path memory module 18, the path memory module 18 can be simplified (that is, the first-stage selector module 2201 of the path memory module 18 can be removed). In FIG. 3, the partial response is PR(1,2,1), so according to step 502, after receiving the partial response PR(1,2,1), an amount Nrs of redundant selector modules can be determined based on a tap number Tap (in this embodiment, the tap number Tap=3) of the partial response, where the amount Nrs of redundant selector modules is calculated by rules as following:

$$Nrs = Tap - k$$

$$2 \leq k < Tap$$

where k is an integer. Therefore, in this embodiment, k=2 for Tap=3, and the amount Nrs=1 (meaning that the first-stage selector module 2201 of the path memory module 18 can be removed). As a result, a high-efficiency Viterbi decoder can be provided, which removes the first-stage selector module 2201 of the path memory module 18.

In addition, the initial input signal of the high-efficiency Viterbi decoder can be determined by analyzing an output signal of the redundant selector module. For example, in this embodiment, the amount Nrs=1, and the output signal of the first-stage selector module 2201 of the path memory module 18 is (0,0,1,1), so (0,0,1,1) is taken as the initial input signal of the high-efficiency Viterbi decoder. Because the initial input signal is determined, the four registers 24 in the first-stage selector module 2202 of the high-efficiency Viterbi decoder, which is the second-stage selector module of the original Viterbi decoder, can be removed.

According to the amount Nrs of the redundant selector modules and the initial input signal, the high-efficiency Viterbi decoder can be determined, and a sequence of data can be decoded with a forward trace status of the high-efficiency Viterbi decoder.

Figure 6:
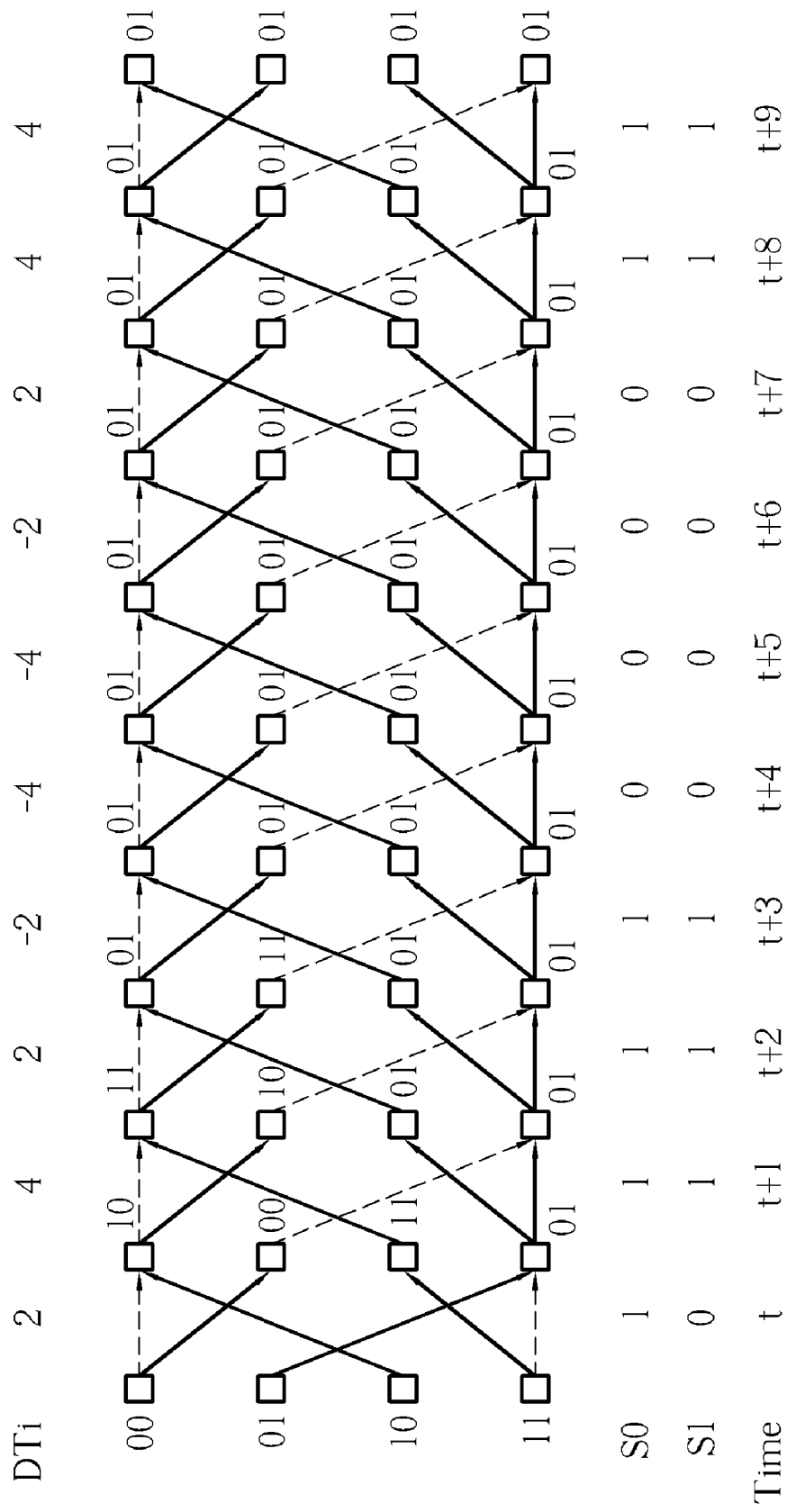
FIG. 6 illustrates a forward trace status diagram of a Viterbi decoder having four states in accordance with the present invention when receiving the first bit of signals in FIG. 4.

Furthermore, please refer to FIG. 6, which illustrates a forward trace status diagram of a Viterbi decoder having four states in accordance with the present invention process 50 when receiving the first bit of the signals DTi. As shown in FIG. 6, when decoding based on the states of the Viterbi decoder, the output signal corresponding to the first bit 2 of the signals DTi is 01. By the same token, please refer to FIG. 7, which illustrates a schematic diagram of output signals DTo of the four-state Viterbi decoder in accordance with the present invention process 50 by decoding the received signals DTi in FIG. 4. As shown in FIG. 7, the first two bits of the original signals can be decoded and included in the output signals DTo.

As to a Viterbi decoder of a prior art HD-DVD drive, the Viterbi decoder should include 20 selector modules for outputting reliable output signals, but the first three bits of the original signals still cannot be decoded. Please refer to FIG. 8, which illustrates a schematic diagram of the path memory module 80 of a Viterbi decoder of an HD-DVD drive Viterbi decoder in accordance with the present invention process 50, where the partial response is PR(1,2,2,2,1). According to step 502, after receiving the partial response PR(1,2,2,2,1), an amount Nrs of redundant selector modules can be calculated based on a tap number Tap (in this embodiment, Tap=5) of the partial response. As mentioned above, the rule for calculating the amount Nrs are as following:

$$Nrs = Tap - k$$

$$2 \leq k < Tap$$

where k is an integer. Therefore, with Tap=5 and k=2, the amount Nrs equals 3 for removing three selector modules, with Tap=5 and k=3, the amount Nrs equals 2 for removing two selector modules, and so on.

Figure 8:
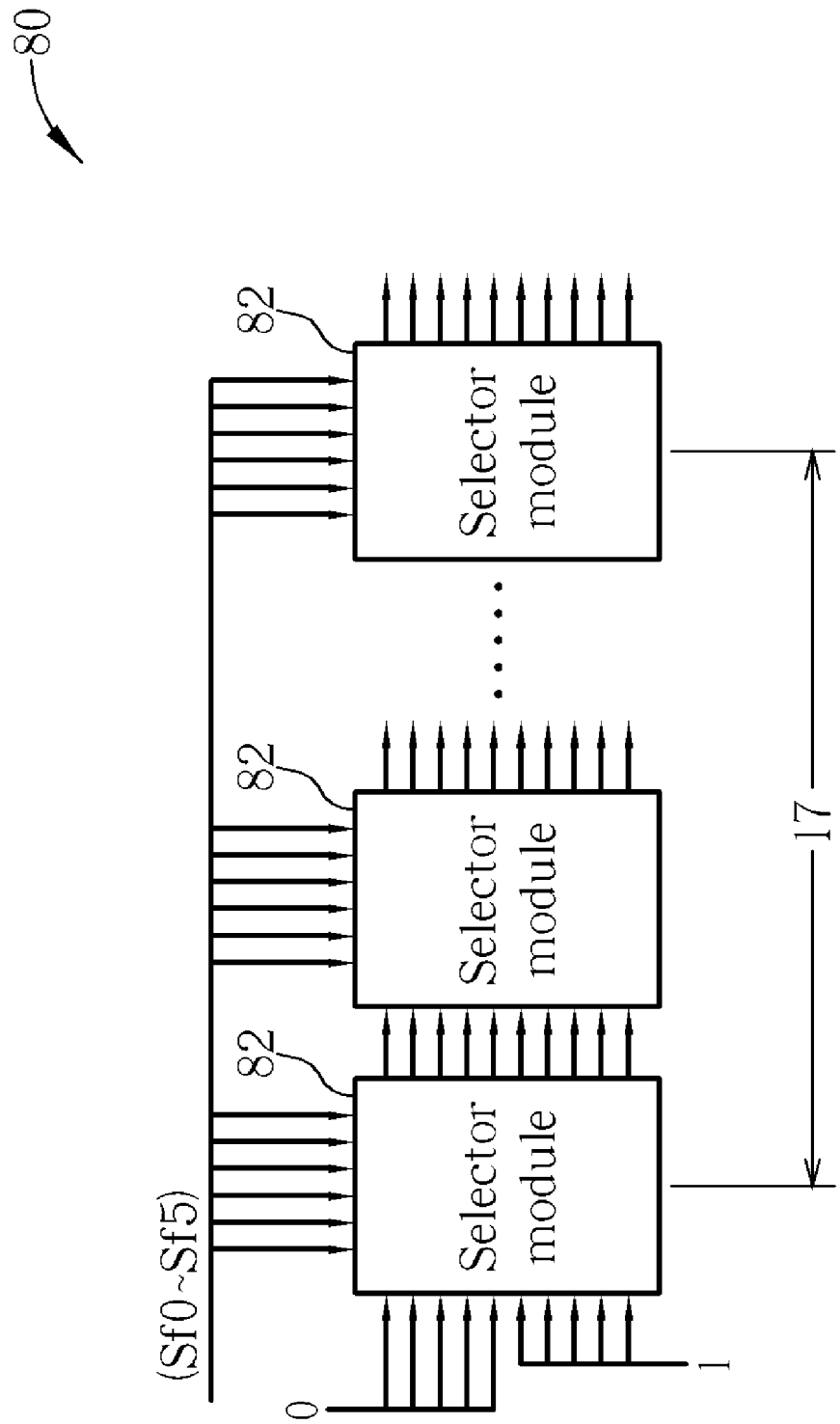
FIG. 8 illustrates a schematic diagram of a path memory module of a Viterbi decoder of an HD-DVD drive Viterbi decoder in accordance with the present invention.
Figure 9:
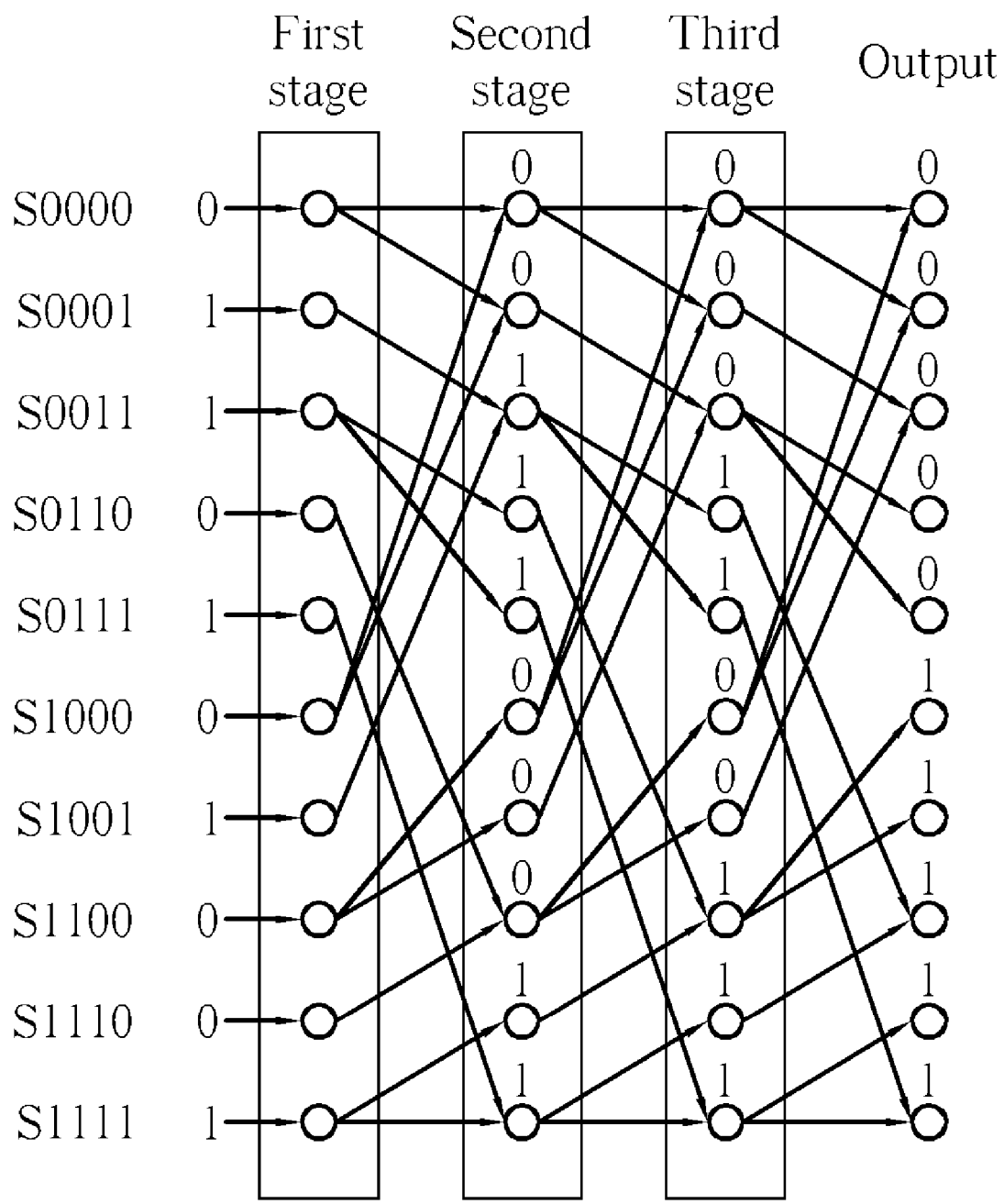
FIG. 9 illustrates a schematic diagram of output signals of first-stage to third-stage selector modules of a prior art Viterbi decoder in an HD-DVD Drive.

As shown in FIG. 8, the path memory module 80 includes 17 selector modules 82 for receiving select signals Sf0~Sf5 provided by the add-compare-select unit of the Viterbi decoder, so as to determine output signals. Please refer to FIG. 9, because the output signal of the third-stage selector module of the Viterbi decoder of the prior art HD-DVD Drive is (0,0,0,0,0,1,1,1,1,1), the initial input signal of the first-stage selector module 82 of the path memory module 80 in FIG. 8 can be (0,0,0,0,0,1,1,1,1,1), and the amount of the selector modules 82 can be reduced to 17. In addition, ten registers (not illustrated) of the first-stage selector module 82 of the path memory module 80 can be removed after the initial input signal is determined. By the same token, the first three bits of the original signal can be decoded by the Viterbi decoder of the HD-DVD Drive in accordance with the present invention process 50.

Therefore, in comparison with the prior art, the present invention process 50 provides a method for simplifying the Viterbi decoder. In short, the process 50 can reduce the selector modules of the path memory module in the Viterbi decoder, and prevent delays of output signals, which increases decoding efficiency of the Viterbi decoder and decreases system resources.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for simplifying a Viterbi decoder, comprising:
   receiving a partial response, and determining an amount of redundant selector modules according to a tap number of the partial response;
   analyzing an output signal of the redundant selector modules for determining an initial input signal; and
   taking Viterbi decoding process to a sequence of data in the Viterbi decoder according to a forward trace status and the initial input signal, wherein the amount of the redundant selector modules (Nrs) is determined by the following:

$Nrs = Tap - k$ $2 \leq k < Tap$ where k is an integer, Nrs is the amount of redundant selector modules and Tap is the tap number of the partial response.

2. The method of claim 1, wherein the initial input signal is the output signal of the redundant selector modules.

3. The method of claim 1, wherein the Viterbi decoder is set in a high-density digital-versatile-disc (HD-DVD) drive for taking Viterbi decoding process to the sequence of data.

4. The method of claim 3, wherein a path memory module of the Viterbi decoder comprises 17 selector modules.

5. The method of claim 3, wherein the initial input signal of the first-stage selector module of the path memory module in the Viterbi decoder is (0,0,0,0,0,1,1,1,1,1).

6. A simplified viterbi decoder, comprising:
   an add-compare-select unit for determining path metrics of a input signal; and
   a path memory module for receiving a plurality of state values calculated by the add-compare-select unit;
   wherein the path memory module includes a plurality of selector modules in a series connection, wherein an amount of the selector modules is determined as the redundant selector modules by a tap number of a partial response and an initial input signal is determined by analyzing an output signal of the redundant selector modules;
   wherein the redundant selector modules (Nrs) is determined by the following:

$Nrs = Tap - k$ $2 \leq k < Tap$ where k is an integer, Nrs is the amount of redundant selector modules and Tap is the tap number of the partial response.

7. The simplified viterbi decoder of claim 6, wherein an amount of registers which are removed in a first-stage of the selector modules is determined by the initial input signal.

8. The simplified viterbi decoder of claim 6, wherein the initial input signal is an output signal of the redundant selector modules.

9. The simplified viterbi decoder of claim 7, wherein the initial input signal of the first-stage of the selector modules is (0,0,0,0,0,1,1,1,1,1).

* * * * *